(12) United States Patent
Welborn et al.

(10) Patent No.: US 7,444,556 B2
(45) Date of Patent: Oct. 28, 2008

(54) SYSTEM AND METHOD OF INTERLEAVING TRANSMITTED DATA

(75) Inventors: Matthew L. Welborn, Vienna, VA (US); William M. Shvodian, McLean, VA (US)

(73) Assignee: Freescale Semiconductor, Inc., Austin, TX (US)

( * ) Notice: Subject to any disclaimer, the term of this patent is extended or adjusted under 35 U.S.C. 154(b) by 741 days.

(21) Appl. No.: 11/128,268

(22) Filed: May 13, 2005

(65) Prior Publication Data

US 2006/0259843 A1   Nov. 16, 2006

(51) Int. Cl.
*G06F 11/00* (2006.01)
*G11C 29/00* (2006.01)
*G01R 31/28* (2006.01)

(52) U.S. Cl. .................. 714/702; 714/701; 714/726

(58) Field of Classification Search .............. None
See application file for complete search history.

(56) References Cited

U.S. PATENT DOCUMENTS

| | | | | |
|---|---|---|---|---|
| 5,021,987 A * | 6/1991 | Chan et al. | ................... | 708/607 |
| 6,282,149 B1 * | 8/2001 | Pittau | .................... | 365/233.14 |
| 6,614,864 B1 * | 9/2003 | Raphaeli et al. | ............. | 375/371 |

\* cited by examiner

*Primary Examiner*—Christine T Tu

(57) ABSTRACT

A method (500) is provided for operating an interleaver circuit 120 having N shift lines ($220_1$-$220_N$). Each shift line has a line input node, a line output node, and one or more bit storage elements (240). The method includes: storing don't-care bits in each bit storage element (520); isolating the line output nodes from an interleaver output node (520); receiving a stream of data bits at an interleaver input node (530); and sequentially connecting the interleaver input node to respective line input nodes to shift the stream of data bits into the bit storage elements of corresponding shift lines in an interleaved fashion (530). A don't-care bit is shifted out of each of the bit storage elements in corresponding shift lines as each data bit is shifted in. A last don't-care bit is shifted out of respective bit storage elements in the shift lines during N consecutively-received data bits.

20 Claims, 9 Drawing Sheets

SYSTEM AND METHOD OF INTERLEAVING TRANSMITTED DATA

FIELD OF THE INVENTION

The present invention relates in general to the operation of a wireless network, and more particularly to a system and method of allowing a transmitter device in the network to interleave data for transmission, and allowing a receiver device in the network to de-interleave the transmitted data.

BACKGROUND OF THE INVENTION

A digital wireless transmitter operates by sending a sequence of data bits to a remote device using any of a variety of transmission means. In many cases, these data bits are in a particular order that must be preserved for them to be properly interpreted at the remote device. For example, if the data bits represent sound and picture in a video stream, the bits at the remote device must be processed in the same order that they were provided to the transmitter for the sound and video to be properly displayed.

One way to accomplish this is to have the transmitter send the data bits via a data stream in exactly the same order that it received them. With this approach, the remote device need only receive the bits and process them in the order that they appear in the data stream to capture the proper ordering of data. Unfortunately while simple to implement, this approach leaves the data stream very susceptible to being disrupted by burst errors.

Burst errors occur when a number of adjacent data bits are corrupted because of a temporary decline in channel performance. This might happen because of a temporary interfering signal, because of an obstruction moving through the channel, because of multipath fading, which results when the signal level drops to the effects of multipath propagation in either a mobile or stationary device, or the like. During this temporary decline in channel performance, a series of transmitted bits will be interfered with causing them to be sent incorrectly. If uncorrected, these bit errors can reduce the quality of the transmitted signal.

Now many devices will have mechanisms in place to correct individual bit errors. For example, forward error correction (FEC) can be used on a bit stream to correct a certain number of bit errors in an ordered bit stream. However, when too many bit errors occur in a close area in the ordered bit stream, then FEC cannot fully reconstruct the original data.

One way to address this problem is to mix up (i.e., permute) the data prior to transmission in a predictable way such that the data can be reconstructed at the remote device. In particular, the data can be permuted such that two data bits that are adjacent in the original data stream are at least a certain number of bits apart in the permuted data stream. The greater this separation length, the more resistant the transmitted data will be to burst errors.

As noted above, burst errors affect adjacent data bits in the transmitted data stream. But if the data is transmitted using permuted data bits, then adjacent bits in the transmitted stream will not be adjacent bits in the original ordered data stream. As a result, the bit errors caused by a burst error will thus be spread out in the reassembled original data stream. And since the bit errors will be spread out, signal processing, such as FEC, can better correct for these errors and reconstruct the original data stream.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

DETAILED DESCRIPTION

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, are best supported with or in software or integrated circuits (ICs), such as a digital signal processor and software therefore or application specific ICs. It is expected that one of ordinary skill, notwithstanding possibly significant effort and many design choices motivated by, for example, available time, current technology, and economic considerations, when guided by the concepts and principles disclosed herein will be readily capable of generating such software instructions or ICs with minimal experimentation. Therefore, in the interest of brevity and minimization of any risk of obscuring the principles and concepts according to the present invention, further discussion of such software and ICs, if any, will be limited to the essentials with respect to the principles and concepts used by the exemplary embodiments.

Wireless Network

Figure 1:
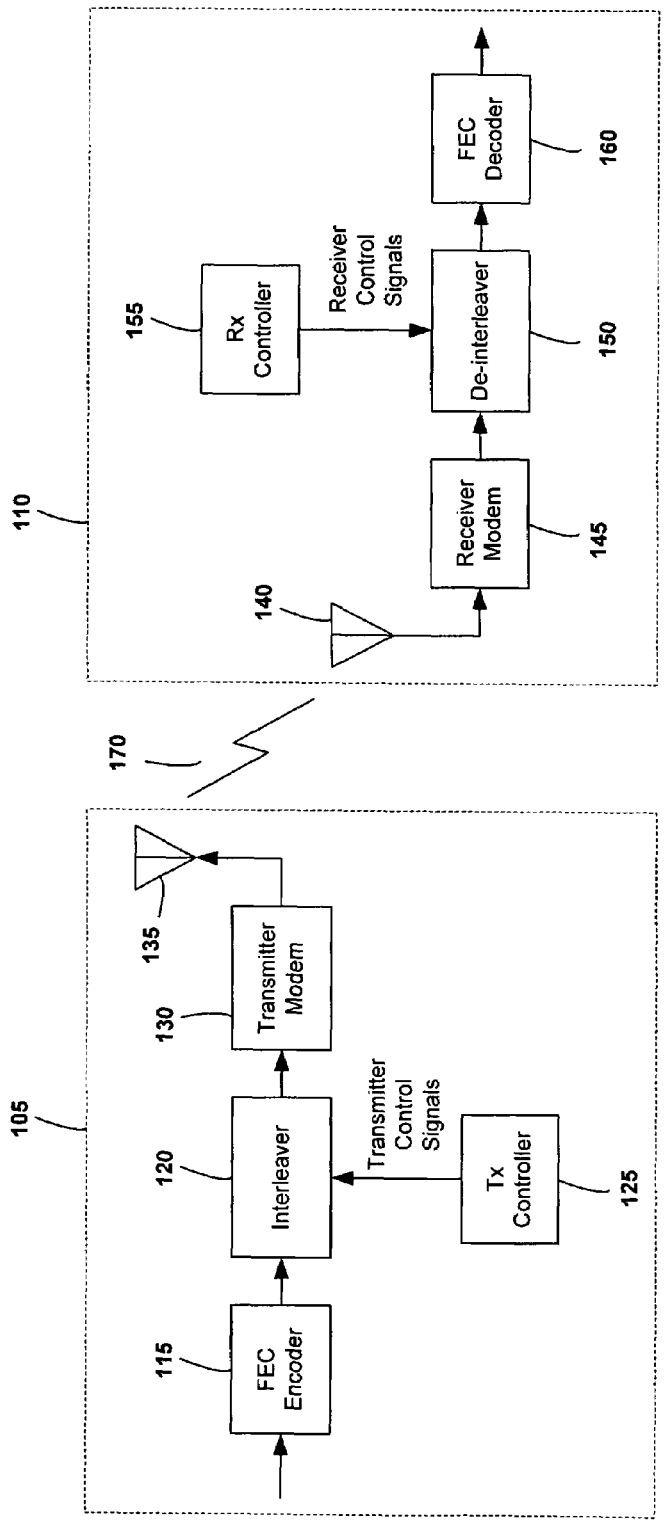
FIG. 1 is a block diagram of a transmitter and a receiver according to a disclosed embodiment of the present invention.

FIG. 1 is a block diagram of a transmitter and a receiver according to a disclosed embodiment of the present invention. As shown in FIG. 1, a transmitter-receiver system includes a transmitter 105 and a receiver 110. The transmitter 105 further includes a forward error correction (FEC) encoder 115, an interleaver 120, a transmitter controller 125, a transmitter modem 130, and a transmitter antenna 135. The receiver 110 further includes a receiver antenna 140, a receiver modem 145, a de-interleaver 150, a receiver controller 155, and a FEC decoder 160. In operation the transmitter 105 transmits data via a wireless signal 170 to the receiver 110.

The FEC encoder 115 receives an unencoded bit stream and encodes it to produce a signal for transmission that is properly encoded for forward error correction. The level of FEC encoding used can vary for different embodiments. The disclosed embodiment uses FEC decoding k=4 or 6 and a rate=½ or ¾, though alternate embodiments could use other FEC parameters.

The interleaver 120 takes the encoded bit stream and mixes the data in a known manner to form an interleaved data stream. The interleaved bit stream is formed such that adjacent data bits in the encoded data stream are separated in the interleaved data stream.

The transmitter controller 125 provides transmitter control signals to control the operation of the interleaver 120. The transmitter controller 125 may be a microprocessor controller or a circuit designed specifically to perform the required transmitter controlling functions.

The transmitter modem 130 receives the interleaved bit stream and prepares it for transmission via the transmitter antenna 135 in a manner known to one skilled in the art. The transmitter antenna 135 then transmits the interleaved data stream as a wireless transmission 170 over a wireless channel.

The receiver antenna 140 receives the wireless transmission 170 and provides it to the receiver modem 145, which processes it in a manner known to one skilled in the art. The receiver modem then provides a received interleaved data stream to the de-interleaver 150. As noted above, since the wireless transmission 170 may have suffered burst errors, the received interleaved data stream may not be identical to the transmitted interleaved data stream.

The de-interleaver 150 takes the received interleaved data stream and performs a de-interleaving process on it. This de-interleaving process is paired with the interleaving process and is provided to return the received interleaved data stream to its original order, i.e., to return it to an encoded bit stream. When this is done, any bit errors caused by burst errors will be spread out among a received encoded bit stream.

Although referred to here and throughout the specification as a de-interleaver, this element is performing an interleaving function, and could also be referred to as an interleaver. However, when positioned in a receiver 110 and operating on a permuted data stream, its interleaving process serves to de-interleave and already interleaved data stream. To avoid confusion in this following description, the interleaver in the receiver 110 will be called a de-interleaver.

The receiver controller 155 provides receiver control signals to control the operation of the de-interleaver 150. The receiver controller 1525 may be a microprocessor controller or a circuit designed specifically to perform the required receiver controlling functions.

The FEC decoder 160 takes the received encoded bit stream and performs a FEC decoding process on it to produce a received unencoded bit stream. Forward error correction (FEC) performed by the FEC decoder 160 can reduce or eliminate the effect of burst errors. And as noted, FEC is much more effective if bit errors are spread out rather than grouped together.

Although not shown, other operations can be performed within the transmitter 105 and the receiver 110. For example, certain front end operations can be performed on the bit streams prior to transmission or after reception to improve their quality; the signal can be equalized to compensate for multipath interference; the signal can be filtered to reject in-band or out-of-band interfering signals; etc.

Interleaver Operation

In order to operate properly, an interleaver must split data up in a predictable way, and a corresponding de-interleaver must reassemble the data to recover the original data order. Two types of interleaver are a block interleaver and a convolutional interleaver.

In a block interleaver system both the interleaver and de-interleaver are M×N bit storage devices (e.g., random access memories, bit registers, etc.), where M and N are both integers. Data is stored in the bit storage devices by row and is read out by column (or vice versa). The resulting interleaved data stream thus has adjacent ordered bits separated from each other. In the de-interleaver, incoming data is stored in a corresponding bit storage device by column and is read out by row (or vice versa), in a way that complements the way the data was permuted by the interleaver. This has the effect of reversing the interleaving process, returning the data to its original order.

The convolutional interleaver includes N rows, each having M or fewer bit storage devices connected linearly, but with at least one row having fewer than M bit storage devices, where M and N are both integers. The corresponding convolutional de-interleaver would be the complement of the interleaver, having N rows each also having M or fewer bit storage devices connected linearly, but arranged such that the sum of bit storage devices in corresponding rows of the interleaver and the de-interleaver are equal to K, where K is an integer greater than or equal to M. In other words, the sum of bit storage devices in the first row of the interleaver and the first row of the de-interleaver should be equal to K, the sum of bit storage devices in the second row of the interleaver and the second row of the de-interleaver should be equal to K, the sum of bit storage devices in the third row of the interleaver and the third row of the de-interleaver should be equal to K, etc. In one embodiment K=M, though larger values of K are possible.

The bit storage devices in each row of the interleaver and the de-interleaver are connected together in a shifting relationship such that when a new bit of data is entered into a first bit storage device each device shifts the stored bits by one position, and the last bit of data in the row is shifted out and passed along. One way of implementing this is to have each row of the interleaver and the de-interleaver be a shift register. In alternate embodiments a controlled memory device can be controlled to achieve this shifting functionality.

Switches in the interleaver and de-interleaver are then controlled such that each bit of data will pass through the same line of the interleaver and de-interleaver, i.e., both through the first line, or both through the second line, etc. As a result, once a signal passes through both the interleaver and de-interleaver, each bit of data will be shifted through the same number of bit storage devices, and thus the final order of data will remain unchanged. However, once the data passes out of the interleaver, but before it passes through the de-interleaver, the original order of the data stream will be permuted such that adjacent data in the ordered stream will not be adjacent in the permuted stream.

In various embodiments the bit storage devices can be single-bit storage devices holding a single bit, or can be multiple-bit storage devices each capable of storing a plurality of bits. Conceptually the operation is the same. However, for implementation purposes it may be simpler to use multiple-bit storage devices.

Block interleavers are simple in design and operation, but require larger memories and so increase both the size and complexity of a design. Convolutional interleavers require careful line shifting, but are smaller and realize a corresponding reduction in size and complexity.

Figure 2:
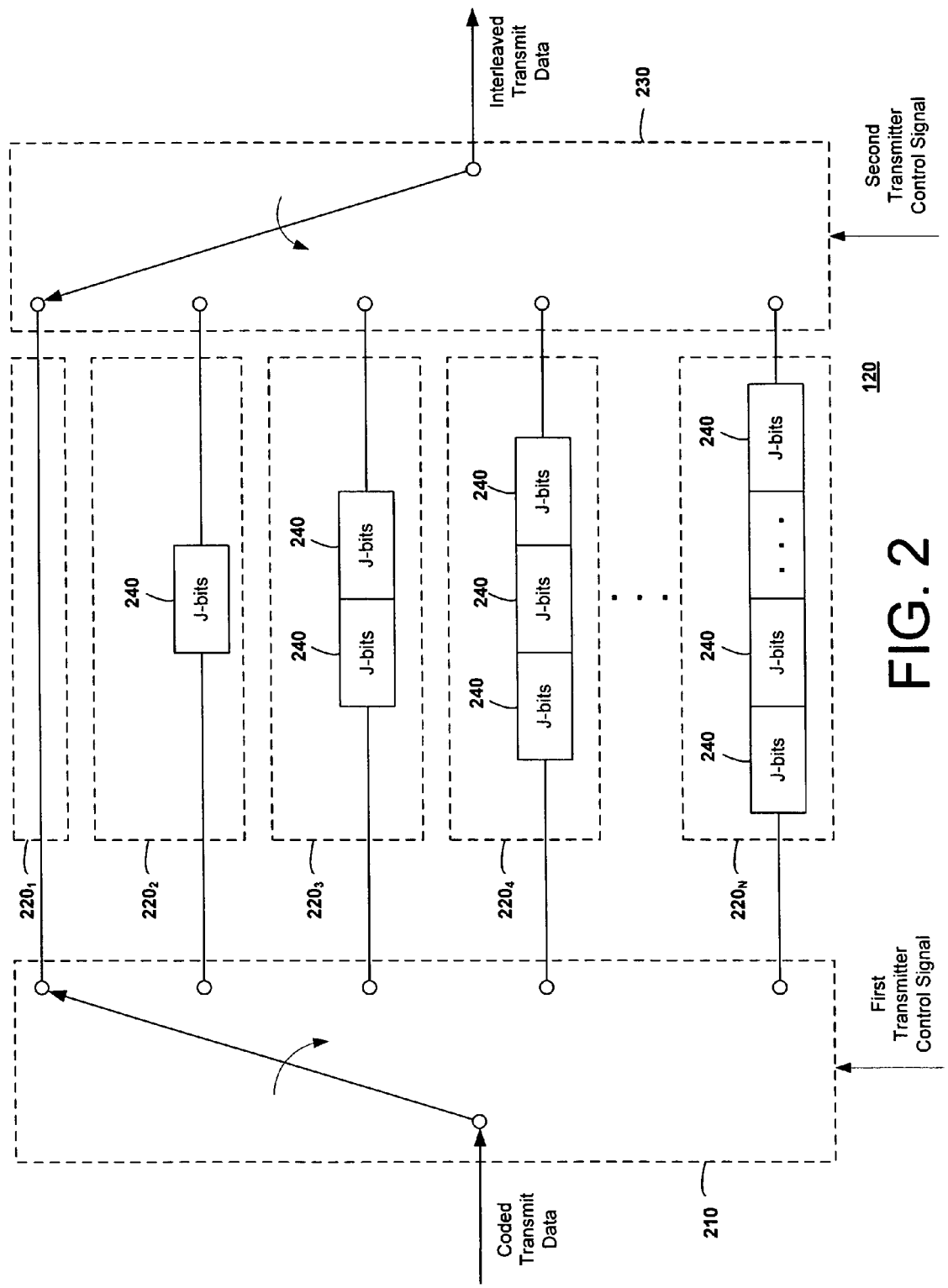
FIG. 2 is a block diagram of an exemplary convolutional interleaver circuit in a transmitter device according to a disclosed embodiment of the present invention.
Figure 3:
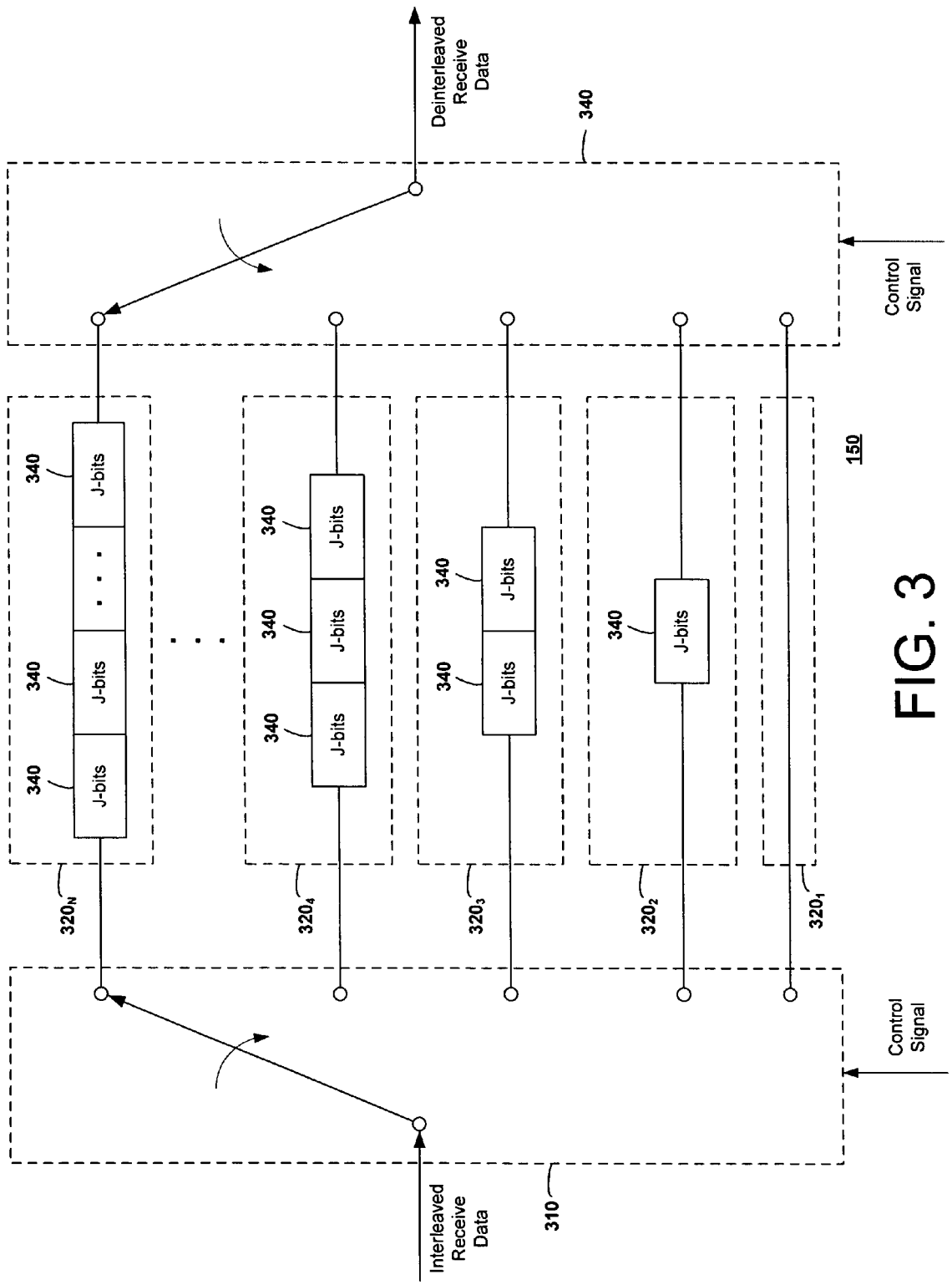
FIG. 3 is a block diagram of an exemplary convolutional de-interleaver circuit in a receiver device that corresponding to the transmitter interleaver of FIG. 2, according to a disclosed embodiment of the present invention.

FIG. 2 is a block diagram of an exemplary convolutional interleaver circuit in a transmitter device according to a disclosed embodiment of the present invention. This could serve the function of the interleaver 120 of FIG. 1. FIG. 3 is a block diagram of an exemplary convolutional de-interleaver circuit in a receiver device that corresponds to the transmitter interleaver of FIG. 2, according to a disclosed embodiment of the present invention. This could serve the function of the de-interleaver 150 of FIG. 1.

As shown in FIG. 2, the interleaver 120 includes an interleaver input switch 210, first through $N^{th}$ interleaver rows $220_1$ to $220_N$, and an interleaver output switch 230.

The interleaver input switch 210 is controllable by a first transmitter control signal to connect to a first end of one of the first through $N^{th}$ interleaver rows $220_1$ to $220_N$.

Each of the first through $N^{th}$ interleaver rows $220_1$ to $220_N$ contains zero or more J-bit shift registers connected in series, where J is an integer greater than or equal to 1. In particular, the first interleaver row $220_1$ contains no shift registers (i.e., it has length zero), while each subsequent interleaver row contains one more than the previous row, until the $N^{th}$ interleaver row $220_N$ contains (N−1) J-bit shift registers (i.e., it has length (N−1)). In one particular embodiment N=10, and J=7, though these values could vary for alternate embodiments.

The interleaver output switch 230 is controllable by a second transmitter control signal to connect to a second end of one of the first through $N^{th}$ interleaver rows $220_1$ to $220_N$.

In operation the interleaver input switch 210 and the interleaver output switch 230 are controlled such that each is connected to the same one of the first through $N^{th}$ interleaver rows $220_1$ to $220_N$ for one bit length. The switches 210 and 230 cycle through the first through $N^{th}$ interleaver rows $220_1$ to $220_N$ over N total bit lengths, changing their connections once every bit length. They then continue repeating this pattern for as long as the interleaver 120 receives data for transmission to the receiver 110.

Each time a bit is received at an input of the interleaver 120, the interleaver input switch 210 causes that bit to be provided to one of the interleaver rows $220_1$ through $220_N$, and the interleaver output switch 230 causes a bit from that same row to be provided to the modem 120. If the row has a length zero (i.e., no bit register 240), then the received bit is passed as is. If, however, the row has a length of greater than zero (i.e., has one or more bit registers 240), the received bit is placed into the first spot in the one or more bit registers 240 of that row, all of the other bits shift one position closer to the output, and the last bit stored in the one or more bit registers 240 is passed as an output bit.

FIG. 3 is a block diagram of an exemplary convolutional de-interleaver circuit in a receiver device that corresponds to the transmitter interleaver of FIG. 2, according to a disclosed embodiment of the present invention. This could serve the function of the de-interleaver 150 of FIG. 1.

As shown in FIG. 3, the de-interleaver 150 includes a de-interleaver input switch 310, first through $N^{th}$ de-interleaver rows $320_1$ to $320_N$, and a de-interleaver output switch 330.

The de-interleaver input switch 310 is controllable by a first receiver control signal to connect to a first end of one of the first through $N^{th}$ de-interleaver rows $320_1$ to $320_N$.

Each of the first through $N^{th}$ de-interleaver rows $320_1$ to $320_N$ contains zero or more J-bit shift registers 340 connected in series. In particular, the first de-interleaver row $320_1$ contains (N−1) shift registers 340 (i.e., it has length (N−1)), while each subsequent de-interleaver row contains one fewer shift register 340 than the previous de-interleaver row, until the $N^{th}$ de-interleaver row $320_N$ contains (N−1) J-bit shift registers 340 (i.e., it has length (N−1)).

The de-interleaver output switch 330 is controllable by a second transmitter control signal to connect to a second end of one of the first through $N^{th}$ rows $320_1$ to $320_N$.

In operation the de-interleaver input switch 310 and the de-interleaver output switch 330 are controlled such that each is connected to the same one of the first through $N^{th}$ de-interleaver rows $320_1$ to $320_N$ for one bit length. The switches 310 and 330 cycle through the first through $N^{th}$ de-interleaver rows $320_1$ to $320_N$ over N total bit lengths, changing their connections once every bit length. They then continue repeating this pattern for as long as the de-interleaver 150 receives data from the receiver modem 145.

Each time a bit is received at an input of the de-interleaver 150, the de-interleaver input switch 310 causes that bit to be provided to one of the de-interleaver rows $320_1$ through $320_N$, and the de-interleaver output switch 330 causes a bit from that same row to be provided to the FEC decoder 160. If the row has a length zero (i.e., no bit register 340), then the received bit is passed as is. If, however, the row has a length of greater than zero (i.e., has one or more bit registers 340), the received bit is placed into the first spot in the one or more bit registers 340, all of the other bits shift one position closer to the output, and the last bit stored in the one or more bit registers 340 is passed as an output bit.

Although the description of the de-interleaver refers to manipulating bits and bit values, some embodiments may use one or more soft representations of incoming bit values at the de-interleaver 150 instead of final bit values. For example, instead of processing one hard bit with a value of "0" or "1," the de-interleaver 150 might process four soft bit values between 0 and 1 in place of a bit value. These soft representations can then later be converted into bit values.

Regardless, the manipulation of the order of the bits or bit representations is performed in the same manner, with multiple soft representations of the same bit being treated to the same delays. However, for ease of disclosure the following description will refer to the de-interleaver as manipulating bits, though it could be manipulating bits or bit representations.

The transmitter control signals and the receiver control signals are coordinated such that bits that pass through a given row of the interleaver 120 pass through a corresponding row of the interleaver 150 (i.e., a bit that passes through the first row of the interleaver 120 passes through the first row of the de-interleaver 150, etc.).

Although in the description of FIGS. 2 and 3, the interleaver 120 and de-interleaver 150 have been shown as having multiple J-bit shift registers, alternate embodiments could use a single shift register that increases in size by J bits each row. Other alternate embodiments could use other memory implementations that operate to perform a similar shifting operation.

In addition, alternate embodiments need not increase the bit length of each row by a set amount, but could increase their lengths by an arbitrary amount. Other alternate embodiments need not have the rows' bit length steadily increase, but could row lengths vary in bit length, sometimes being larger than the previous row and sometimes being smaller.

Other alternate embodiments can vary the position of the row connections, e.g., what passes through the first row of the interleaver might pass through the third row of the de-interleaver, etc., so long as the property of equal delay for every bit is maintained.

Regardless of the embodiment, however, the row lengths and switch positions of the interleaver 120 and de-interleaver 150 should be controlled such that each bit of data passing through both the interleaver 120 and de-interleaver 150 experiences the same number of data shifts.

In certain alternate embodiments a larger or smaller number of rows could be used in either the interleaver 120 or the de-interleaver 150, so long as the property of equal delay for every bit is maintained. For example, an interleaver 120 might have four rows and a de-interleaver 150 might have eight rows, all arranged and switched such that every bit passing through both would have the same delay.

Furthermore, although FIG. 2 identifies an interleaver 120 in a transmitter 105 and FIG. 3 identifies a de-interleaver 150 in a receiver 110, the same circuitry could be used in a transceiver as both an interleaver 120 and a de-interleaver 150, depending upon whether the transceiver was operating to transmit or receive. In each case, the control signals would have to be adjusted such that the proper rows would be connected at the proper time.

In the embodiment disclosed in FIGS. 2 and 3, the number of spaces in the bit registers 240, 340 in each of the interleaver 120 and de-interleaver is equal to:

$$L = J \cdot \frac{N \cdot (N-1)}{2}.$$

If N=10 and J=7, then L=315. However, the value for L will change in alternate embodiments as N and J vary. Furthermore, should the exact makeup of the interleaver 120 and de-interleaver 150 change, the formula for determining L will be altered appropriately.

At the beginning of signal transmission, before the interleaver 120 receives any data bits, the various bit registers 240 in the interleaver 120 are filled with don't-care data. These don't-care bits can be a random set of data provided to the registers 240, a uniform value (e.g., all "1" or all "0"), or just whatever data happened to be in the registers 240 when they were turned on. Regardless, the don't-care bits represent data whose value is unimportant. It is only after the interleaver 120 receives enough data to fill all of its bit registers 240 that the last of the don't care data will disappear.

Thus, at the beginning of data transmission the interleaver 120 is filled with L don't-care bits that must be shifted out and transmitted to the receiver 110 before the interleaver 120 is filled with valid data the transmitted signal only contains valid data bits.

Similarly, at the end of signal transmission, once the interleaver 120 has stopped receiving data bits, the various bit registers 240 in the interleaver 120 will be filled with valid data. This valid data must be sent to the receiver 110, but to do so will require don't-care bits to be provided to the interleaver 120 until the last of the last of the valid data bits are sent.

This means that there are L valid data bits in the interleaver 120 that must be shifted out and sent to the receiver 110. However, since the interleaver input and output switches 210 and 230 cycle evenly through all of the rows $220_1$ through $220_N$ in order, an additional L don't-care bits must be transmitted over the channel before all L valid data bits are shifted out of the bit registers and sent to the receiver 110.

As a result, over the course of a single transmission, the transmitter 105 will have to transmit 2L don't-care bits, during which time the channel time is being used to no good effect.

Furthermore, the de-interleaver 150 will have to spend time cycling those 2L bits of don't-care data through its bit registers 340, thereby increasing signal latency.

The larger the interleaver 120 and de-interleaver 150 (i.e., the greater N and J, and thus L, are), the more channel time is lost each time a new transmission is made and the greater signal latency will be. And the smaller each given data transmission, the more times this loss must be incurred on both sides per quantity of transmitted data.

In a continuous, streaming data transmission, such as a television signal, this is a minor problem since a stream of data transmission does not often start or stop. One data stream might, for example, stop and start only once a day, once a week, or even less frequently.

However, if an interleaver/de-interleaver system is used for packet-based communication then transmissions will start and stop with great regularity. In this case the limitations in the operation described above with respect to FIGS. 2 and 3 could significantly reduce transmission efficiency.

Reduced Overhead for Operation of Transmitter Interleaver

One way to avoid the potential limitations at the beginning of transmission is to use existing overhead time to fill up the interleaver 120. For example, in a packet-based system most data packets (or frames) will have an overhead period at the very beginning for passing acquisition and frame management information. Although these data structures can be called packets or frames, for simplicity of disclosure, the term frame will be used throughout.

Figure 4:
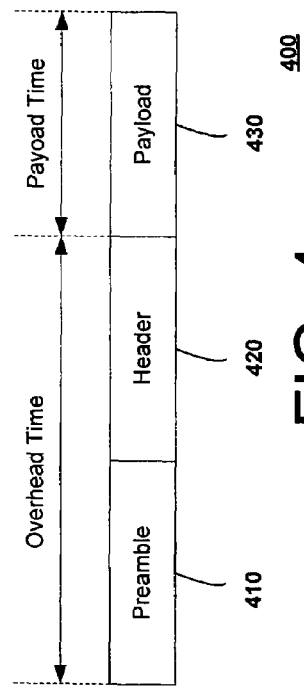
FIG. 4 is a block diagram of an exemplary data frame for packet-based communication according to a disclosed embodiment of the present invention.

FIG. 4 is a block diagram of an exemplary data frame for packet-based communication according to a disclosed embodiment of the present invention. As shown in FIG. 4, a data frame 400 includes a preamble 410, a header 420, and a payload 430.

The preamble 410 is a known sequence with known autocorrelation and cross-correlation properties that is used to allow a receiving device to acquire the transmitted signal. The header 420 provides a variety of definitional data regarding the data frame, such as source device, destination device, frame type, frame length, etc. The payload 430 includes the actual data that is to be transmitted.

In the disclosed data frame 400, the preamble 410 and header 420 are overhead transmissions and are not sent through the interleaver 120. As a result, every data frame 400 has a period of overhead time during which the interleaver 120 need not operate on transmitted bits. This overhead time can be used to fill the interleaver 120 so that when the payload time arrives and the payload 430 is to be sent, no time need be wasted filling the interleaver 120.

In some alternate embodiments the header 420 could be sent through the interleaver 120 (independently from the payload 430, or in conjunction with the payload 430). However, so long as the preamble 410 is not sent through the interleaver 120, there will be overhead time to fill the interleaver 120 with data.

However, since the interleaver 120 is filled during a period when no data is being transmitted, the interleaver input switch 210 should be controlled such that during a fill operation each of the bit registers 240 is filled with valid data, but no valid data is shifted out of any of the rows $220_1$ to $220_N$.

Likewise, when the transmitter 105 stops receiving valid data for transmission and needs to be emptied of its valid data bits, the interleaver 120 is provided with don't-care bits and can be controlled so none of the don't-care bits are passed out of the interleaver 120, but are only provided to shift the valid data bits out of the interleaver 120.

As a result of this, the transmitter 105 operates in three separate stages, a fill stage, a run stage, and an empty stage. In the fill stage the transmitter 105 populates the interleaver 120 with valid data bits; in the run stage, the transmitter 105 sends a stream of valid data bits; and in the empty stage the transmitter empties the interleaver of the remaining valid data bits.

Figure 5:
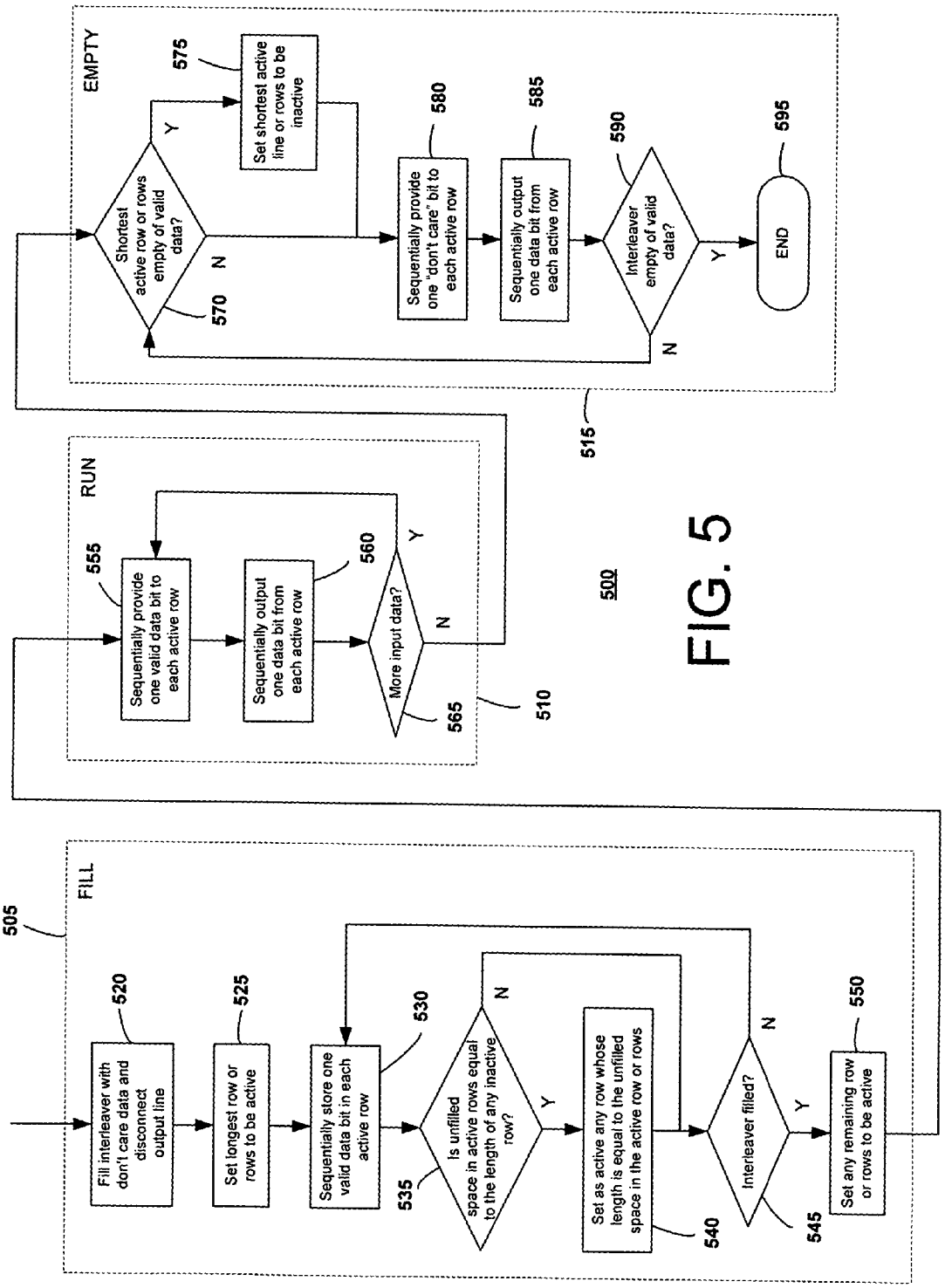
FIG. 5 is a flow chart of the operation of an interleaver circuit in a transmitter device according to a disclosed embodiment of the present invention.

FIG. 5 is a flow chart of the operation of an interleaver circuit in a transmitter device according to a disclosed embodiment of the present invention. As shown in FIG. 5, the operation 500 of the interleaver circuit includes a fill stage 505, a run stage 510, and an empty stage 515.

FIGS. 6 to 9 are block diagrams of the operation of an interleaver circuit in a transmitter device during a fill stage according to a disclosed embodiment of the present invention. As shown in the embodiment of FIGS. 6 to 9, the interleaver 120 includes an interleaver input switch 210, five interleaver rows, and an interleaver output switch 230. The first interleaver row has no bit registers; the second interleaver row has one bit register; the third interleaver row has two bit registers; the fourth interleaver row has three bit registers; and the fifth interleaver row has four bit registers. Each of the bit registers can contain good data (i.e., valid data bits) or don't-care (D/C) data. Although the bit registers can be of varying sizes and therefore can be partly filled with valid and don't-care bits, for simplicity of disclosure they are shown at times when they are either entirely with valid data bits or entirely filled with don't-care bits.

Interleaver Fill Stage

In the fill stage 505, the fill process begins by filling the interleaver with don't-care data and having the interleaver output switch 230 disconnect the interleaver 120 from its output line. (520) Since the fill stage 505 is performed during a time period when the transmitted data need not be permuted, the interleaver 120 is disconnected from the output line. In an alternate embodiment the interleaver 120 can be isolated by alternate means. For example, it could be isolated from the transmitter antenna 135 somewhere in the transmitter modem 130.

Figure 6:
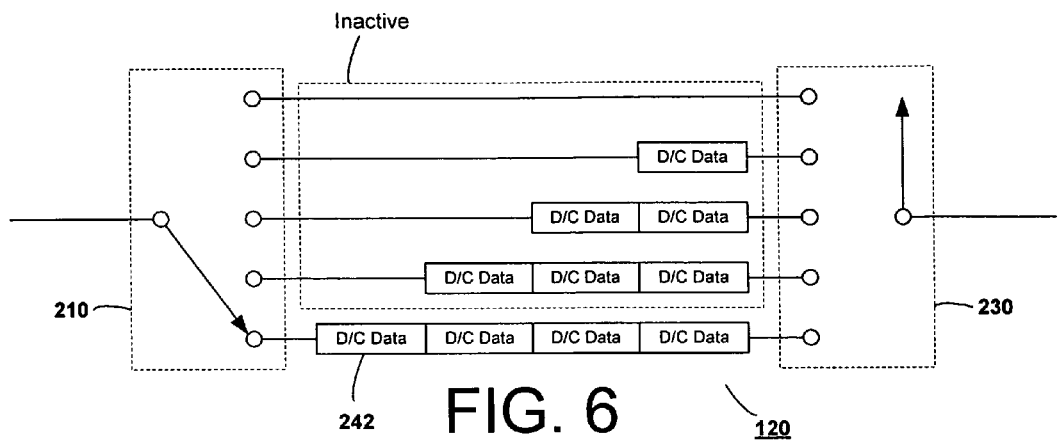
FIGS. 6 to 10 are block diagrams of the operation of an interleaver circuit in a transmitter device during a fill stage according to a disclosed embodiment of the present invention.

After the interleaver 120 is disconnected from its output line, the transmitter controller 125 sets the longest row or rows to be active and sets all of the remaining rows to be inactive. (525) An example of this is shown in FIG. 6. If multiple rows have the same, longest length, then all rows having the longest length are set to be active.

As shown in FIG. 6, the interleaver output switch 230 has disconnected all of the interleaver rows from an output line; the fifth row of the interleaver 120, which has four bit registers, is set to be active; and the first through fourth rows of the interleaver 120, which have fewer than four bit registers, are all set to be inactive. At this point every bit register in the interleaver 120 is filled with don't-care data 242.

After setting the longest row or rows to be active (525), the interleaver 120 receives an incoming stream of data bits and begins to sequentially store one valid data bit into each active row. (530) This shifts one of the don't care bits on that active row out, but since the interleaver output switch 230 is disconnected from all of the rows, this don't-care data just falls out of the interleaver 120 without any effect. In the disclosed embodiment this data storage and shifting occurs is only one row, and so the interleaver input switch 210 doesn't have to shift at all. In alternate embodiments in which multiple rows all had the same, longest length, the interleaver input switch 210 would have to sequentially switch between those rows, once each bit length, to store valid data bits.

After one valid data bit is stored in each active row (530), the transmitter controller 125 determines whether the unfilled space in the active row or rows is equal to the length of any inactive row. (535) If the unfilled space in the active row or rows is not equal to the length of any inactive row, then the transmitter controller 125 determines whether the interleaver 120 is filled. (545) If interleaver 120 is not filled, then the interleaver 120 sequentially stores one valid data bit into each active row (530) and continues processing as before.

The transmitter controller 125 can perform this determination since it knows how many bit values have been received, what the switch connections have been in the de-interleaver 150, and how long each row is.

If the transmitter controller 125 determines that the unfilled space in the active row or rows is equal to the length of an inactive row or rows (535), then the transmitter controller 125 sets as active any row whose length is equal to the unfilled space in the active row or rows. (540). An example of this is shown in FIG. 7.

Figure 7:
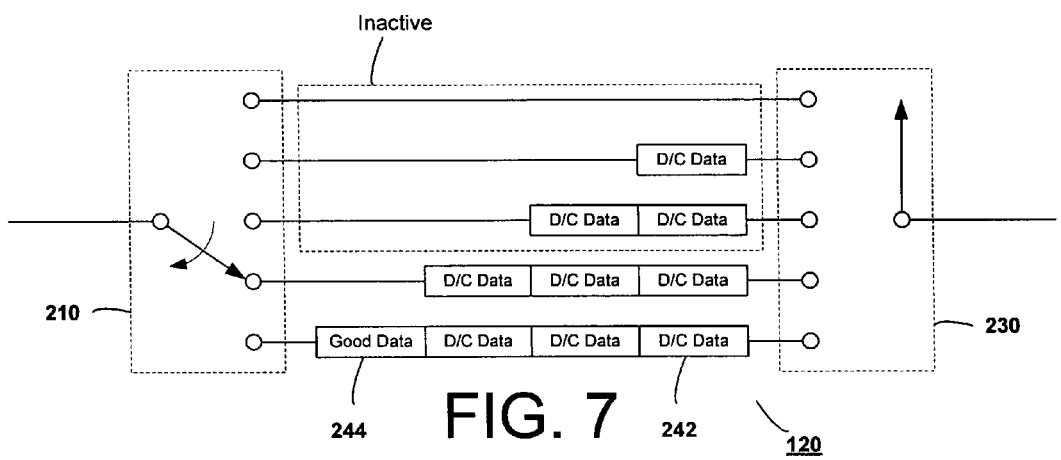

As shown in FIG. 7, the interleaver output switch 230 remains open, disconnecting all of the interleaver rows from the output line, while the fifth row of the interleaver 120 remains active. At this point, the fifth row has one bit register filled with good data 244 and three bit registers filled with don't-care data 242. Since the fourth row also has a length of three bit registers (i.e., the number of unfilled spaced in the fifth line), it is now set to be active, while the first through third rows remain inactive.

The storing of valid data in all active rows (530), the determination of whether unfilled space in active lines is equal to the length of any active rows (535), the setting as active any rows whose length is equal to the unfilled space in active lines (540), and the determination of whether the interleaver is filled (545) continues until the transmitter controller 125 determines that the interleaver is indeed filled. (545)

Figure 8:
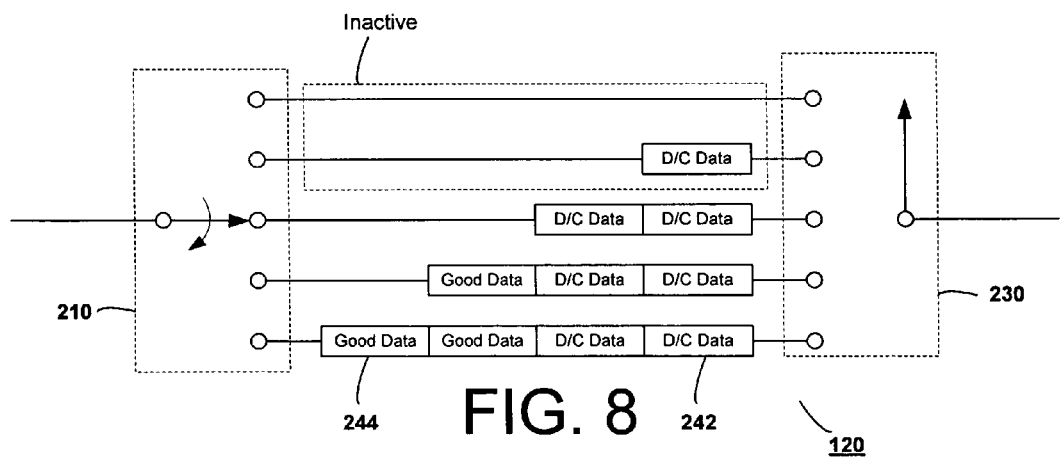
Figure 9:
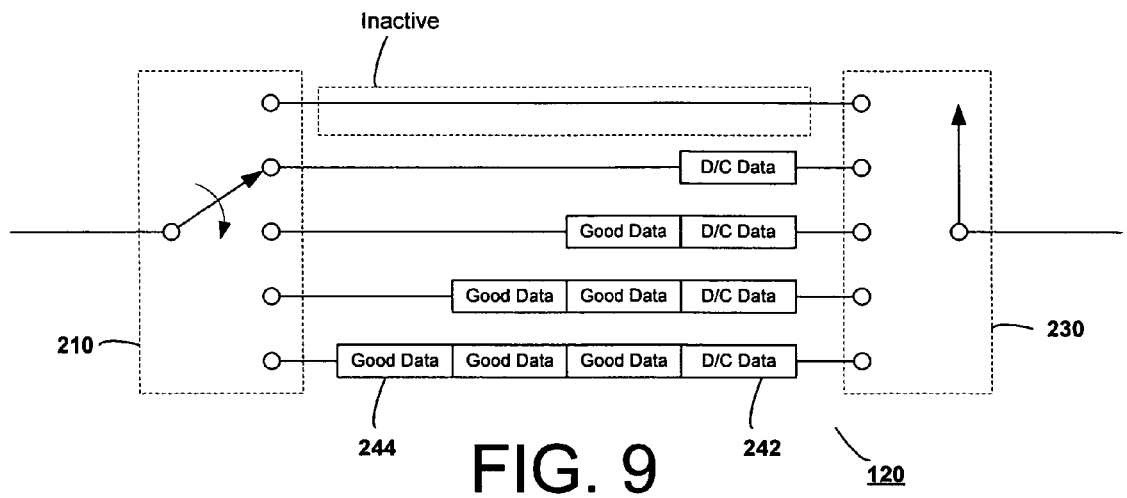

FIGS. 8 and 9 show points in this process at which additional lines are set to be active. As shown in FIG. 8, the interleaver output switch 230 remains open, disconnecting all of the interleaver rows from the output line, while the fourth and fifth rows of the interleaver 120 remain active. At this point, the fourth and fifth rows each have two bit registers filled with good data 244 and two bit registers filled with don't-care data 242. Since the third row also has a length of two bit registers, it is now set to be active, while the first and second rows remain inactive.

As shown in FIG. 9, the interleaver output switch 230 remains open, disconnecting all of the interleaver rows from the output line, while the third through fifth rows of the interleaver 120 remain active. At this point, the third through fifth rows each have three bit registers filled with good data 244 and one bit register filled with don't-care data 242. Since the second row also has a length of one bit register, it is now set to be active, while the first row remains inactive.

Once the transmitter controller 125 determines that the interleaver is filled (545), the transmitter controller 125 sets any remaining row or rows to be active. At this point these rows should only include those of length zero (i.e., those with no bit registers and therefore no don't-care data stored). The fill stage 505 is ended and the run stage 510 begins. The transmitter controller 125 may also cause the interleaver output switch 230 to connect the interleaver to the output line, since no more valid data bits will be received by the interleaver 120 until the payload 430 begins. An example of this is shown in FIG. 10.

Figure 10:
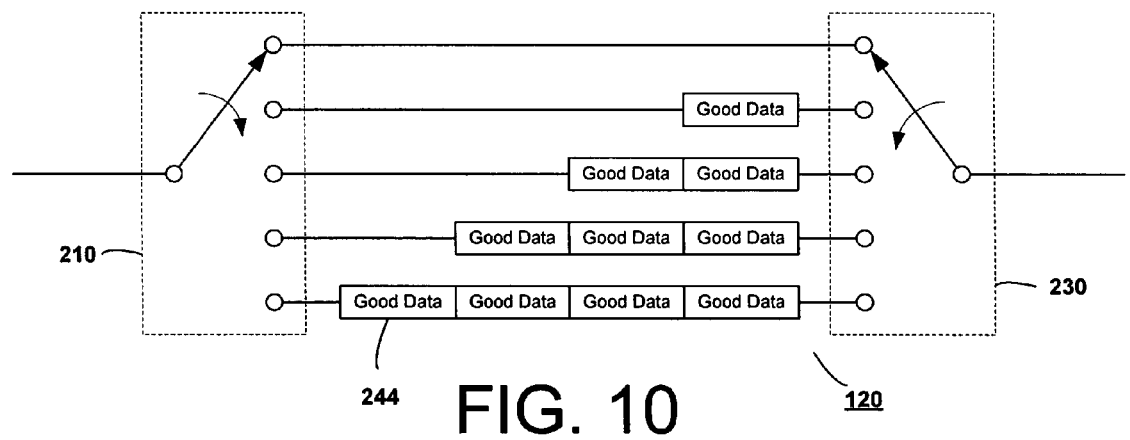

As shown in FIG. 10, once the first through fifth rows are filled with good data 244, the transmitter controller 125 will determine that the interleaver is filled (545). The only remaining inactive row (i.e., the first row) is set to be active, and the output switch 230 is set to again connect the interleaver to the output line.

Interleaver Run Stage

In the run stage 510, the run process begins once the interleaver is filled and the interleaver starts receiving valid data at an input line during a payload period. The transmitter controller 125 operates the interleaver input switch 210 such that it sequentially provides one valid data bit to each active row. (555) Since all rows have by this point been made active (550), this means that one valid data bit is provided to every row.

The transmitter controller 125 operates the interleaver output switch 230 in tandem with the interleaver input switch 210 such that it sequentially outputs one valid data bit from each active row. (560) In any row with a length zero (i.e., no bit register 240), the valid input data bit is simply passed as the valid output data bit. In any row with a length greater than zero (i.e., having at least one bit register 240), the valid input data bit is entered into the first bit register in the row, all of the values in bit registers in the row are shifted one bit closer to the output, and the last bit in the row is provided as a valid output data bit.

Although shown in two separate blocks (555 and 560), the providing of a valid data bit to each active row and the outputting of a valid data bit from each active row may be performed in tandem. In the disclosed embodiment, the interleaver input switch 210 and the interleaver output switch 230 are sequentially connected to each of the active rows at the same time at which point one valid data bit is input to the row and one valid data bit is output from the row. In embodiments that use other memory structures, however, the providing of data and the outputting of data may be performed separately.

In the disclosed embodiment if the transmitter 105 runs out of data in the middle of one cycle of N data bits, it can simply provide don't care bits for the remainder of the cycle This will necessarily be fewer than N don't-care bits, and so their inclusion will have a minimal effect on transmission speed.

In alternate embodiments the transmitter 105 could simply arrange its transmission such that the bit stream sent to the interleaver 120 always included a number of bits that was a multiple of the number of rows in the interleaver.

After a new data bit is provided to each row, and a corresponding data bit is output from each row, the transmitter controller 125 determines whether any more input data is to be provided. (565) If there is more input data, the transmitter controller 125 controls the input switch 210 and the interleaver output switch 230 to again provide a valid data bit to each active row (555), to again output a valid data bit from each active row (560), and to again determine whether there is more input data. (565)

If there is no more input data (565), then the run stage ends and the empty stage begins.

Interleaver Empty Stage

In the empty stage 515, the empty process begins once the interleaver 120 is no longer receiving new valid data at an input line, but instead has only the data bits remaining stored in the interleaver 120 to transmit. The empty stage 515 is essentially the reverse of the fill stage 505, so no specific illustrations are provided. However, FIGS. 6 through 10 examined in reverse essentially show this process, except that during the empty stage 515, the interleaver output switch 230 is connected in synchronization with the interleaver input switch 210 so that the valid data bits stored in the interleaver 120 are provided to the transmitter modem 130 as they are shifted out of the interleaver 120.

The empty stage 515 starts by determining whether the shortest active row or rows are empty of valid data. (570) Since the run stage 510 has just ended, all of the rows are active at the beginning of the empty stage 515. The transmitter controller 125 can perform this determination since it knows how many bit values have been received, what the switch connections have been in the de-interleaver 150, and how long each row is.

If the shortest active row or rows are empty of valid data (570), then the transmitter controller 125 sets the shortest active rows to be inactive. (575) At the beginning of the empty stage 515 this will set any rows of length zero (i.e., having no bit registers) inactive, since rows of length zero by their nature are empty of valid data.

Then, after either none of the shortest active row or rows are determined to be empty of valid data (570), or after the shortest active row with no valid data is set to be inactive (575), the transmitter controller 125 operates the interleaver input switch 210 such that it sequentially provides one don't-care bit to each active row. (580)

The transmitter controller 125 also operates the interleaver output switch 230 in tandem with the interleaver input switch 210 such that it sequentially outputs one valid data bit from each active row. (585) In each active row, the don't-care bit is entered into the first bit register in the row, all of the values in bit registers in the row are shifted one bit closer to the output, and the last bit in the row is provided as a valid output data bit. Since the transmitter controller 125 has blocked out any row with no active data, all remaining rows have at least one valid bit of data.

Although shown in two separate blocks (580 and 585), the providing of a don't-care bit to each active row and the outputting of a valid data bit from each active row may be performed in tandem. In the disclosed embodiment the interleaver input switch 210 and the interleaver output switch 230 are sequentially connected to each of the active rows at the same time at which point one don't-care bit is input to the row and one valid data bit is output from the row. In embodiments that use other memory structures, however, the providing of data and the outputting of data may be performed separately.

After the current active rows have received a don't-care bit (580) and output a valid data bit (585), the transmitter controller 125 determines whether the interleaver 120 is empty of valid data. (590) If not, the transmitter controller 125 again determines whether the shortest active row or rows are empty of valid data (570) and continues processing from there. If the transmitter controller 125 determines that the interleaver 120 is empty of valid data (590), then the empty stage 515 and the entire transmission process 500 ends. (595)

As shown in FIGS. 5 through 10, this process allows the interleaver 120 to be filled and emptied without being forced to transmit large amounts of don't-care bits. As a result, it can avoid wasting channel time and can both increase transmission throughput and decrease latency.

Although FIGS. 6 through 10 show an exemplary interleaver that uses five rows with lengths zero, one, two, three, and four, more or fewer rows can be used, and the lengths of the rows can be varied. In addition, more or fewer bit registers can be used in each line, so long as the same bit register length is not used for all of the lines. Also, although FIGS. 6 through 10 disclose the use of bit registers to store don't-care bits and valid data bits, alternate embodiments could use other memory storage devices for this function, as described above.

Operation of Receiver Interleaver

As noted, for an interleaver/de-interleaver pair to function properly, all data bits passing through the pair must pass through the same delay (e.g., bit shifts in various bit registers) for the de-interleaver to restore the data order permuted by the interleaver. Therefore, if the interleaver 120 embodiment shown in FIGS. 5 through 10 is used in a transmitter 105, the operation and connections of a corresponding de-interleaver 150 must be adjusted accordingly.

Figure 11:
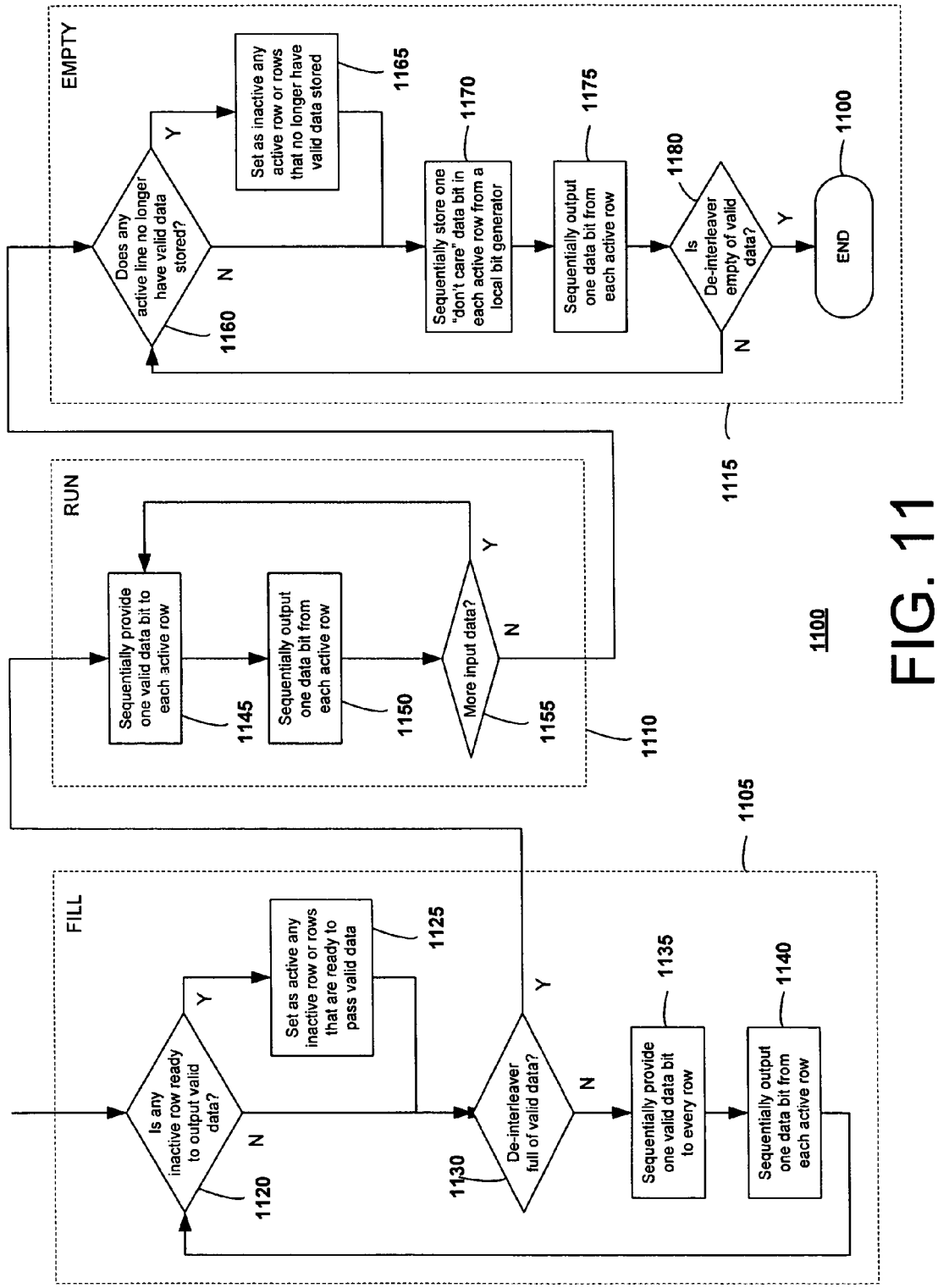
FIG. 11 is a flow chart of the operation of a de-interleaver circuit in a receiver device according to a disclosed embodiment of the present invention.

FIG. 11 is a flow chart of the operation of a de-interleaver circuit in a receiver device according to a disclosed embodiment of the present invention. As shown in FIG. 11, the operation 1100 of the interleaver circuit includes a fill stage 1105, a run stage 1110, and an empty stage 1115.

FIGS. 12 to 16 are block diagrams of the operation of a de-interleaver circuit in a receiver device during a fill stage according to a disclosed embodiment of the present invention. As shown in the embodiment of FIGS. 12 to 16, the de-interleaver 150 includes a de-interleaver input switch 310, five de-interleaver rows, and a de-interleaver output switch 330. The first de-interleaver row has four bit registers; the second de-interleaver row has three bit registers; the third de-interleaver row has two bit registers; the fourth de-interleaver row has one bit register; and the fifth de-interleaver row has zero bit registers. Each of the bit registers can contain good data (i.e., valid data bits) or don't-care (D/C) data. Although the bit registers can be of varying sizes and therefore can be partly filled with valid and don't-care bits, for simplicity of disclosure they are shown at times when they are either entirely with valid data bits or entirely filled with don't-care bits.

De-interleaver Fill Stage

At the start of the fill stage 1105, all of the bit registers in the de-interleaver 150 filled with don't-care bits 342, since the receiver 110 has not yet received any valid data bits from the transmitter. All rows are by default inactive.

The fill stage 1105 begins by having the receiver controller 155 determine whether any of the inactive row or rows is ready to output valid data. (1120) At the start of the fill stage 1105 this will include any rows that have a length of zero (i.e., have no bit registers). If the receiver controller 155 determines that one or more of the inactive row or rows is ready to output valid data (1120) then it sets this row or rows to be active. (1125) If multiple rows are ready to output valid data bits, then all such rows are set to be active. The receiver controller 155 can perform this determination since it knows how many bit values have been received, what the switch connections have been in the de-interleaver 150, and how long each row is.

Then, after either the receiver controller 155 determines that none of the inactive row or rows is ready to output valid data (1120), or the receiver controller 155 sets as active any inactive row or rows that are ready to output valid data (1125), the receiver controller 155 determines whether the de-interleaver 150 is full of valid data bits. (1130)

If the de-interleaver is not full of valid data bits (1130), receiver controller 155 operates the de-interleaver input switch 310 such that it sequentially provides one valid data bit to each row. (1135) Since a stream of valid data is being received from the transmitter 105 (via the receiver modem 145), and these valid data bits need to fill the de-interleaver 150, one valid data bit is provided to every row, regardless of which rows are active.

The receiver controller 155 also operates the de-interleaver output switch 330 in tandem with the de-interleaver input switch 310 such that it sequentially outputs one valid data bit from each active row. (1140) In any row with a length zero (i.e., no bit register 340), the valid input data bit is simply passed as the valid output data bit. In any row with a length greater than zero (i.e., having at least one bit register 340), the valid input data bit is entered into the first bit register in the row, all of the values in bit registers in the row are shifted one bit closer to the output, and the last bit in the row is provided as a valid output data bit.

If at this point not all the rows are active, then the receiver controller 155 can operates the de-interleaver output switch 330 such that it connects the output line only to the active rows, which are the only rows providing valid data bits. However, since the de-interleaver input switch 310 is cycling through all of the rows, connecting to each for one bit duration, the de-interleaver output switch 330 must be controlled to follow the timing of the de-interleaver input switch 310. This means that for bit durations that the de-interleaver input switch 310 is connected to an inactive row, the de-interleaver output switch 330 will remain either disconnected or connected to an active line that has no new valid data bit provided, and whatever bit values appear on the output line of the de-interleaver 150 will be considered a don't-care value. In this case, the don't-care bits shifted out of the inactive lines by the introduction of valid data bits to those lines will simply be discarded.

Figure 12:
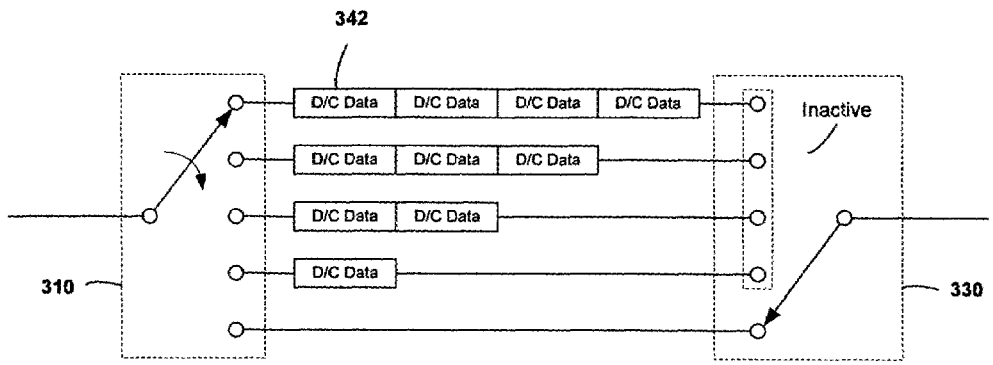
FIGS. 12 to 16 are block diagrams of the of the operation of a de-interleaver circuit in a receiver device during a fill stage according to a disclosed embodiment of the present invention.

FIG. 12 shows an exemplary embodiment of a de-interleaver immediately prior to receiving its first valid bit of data. As shown in FIG. 12, the de-interleaver input switch 310 is controlled such that it will cycle through all five of the rows in the de-interleaver 150 along consecutive bit lengths. In contrast, the de-interleaver output switch 330 is set to connect only to the fifth row, since that is the only one ready to pass a valid data bit, and so the only active row.

In an alternate embodiment, the receiver controller 155 can operates the de-interleaver output switch 330 such that it moves precisely in tandem with the de-interleaver input switch 310. In this case, the don't-care bits output from the inactive lines will be provided as an interleaver output and should be treated as such by later processing.

Regardless, the receiver 105 knows the pattern of don't-care data that will be output from the de-interleaver 150, and so can properly account for it. This don't care data will cause some latency in the received signal, but will not disrupt the processing of the incoming data stream.

Although shown in two separate blocks (1135 and 1140), the providing of a valid data bit to each active row and the outputting of a valid data bit from each active row may be performed in tandem. In the disclosed embodiment the de-interleaver input switch 310 and the de-interleaver output switch 330 are sequentially connected to each of the active rows at the same time at which point one valid data bit is input to the row and one valid data bit is output from the row. As noted above, there may or may not be a relationship between the connections of the de-interleaver input switch 310 and the de-interleaver output switch 330 when the de-interleaver input switch 310 is connected to inactive lines. In embodiments that use other memory structures, however, the providing of data and the outputting of data may be performed separately.

Figure 13:
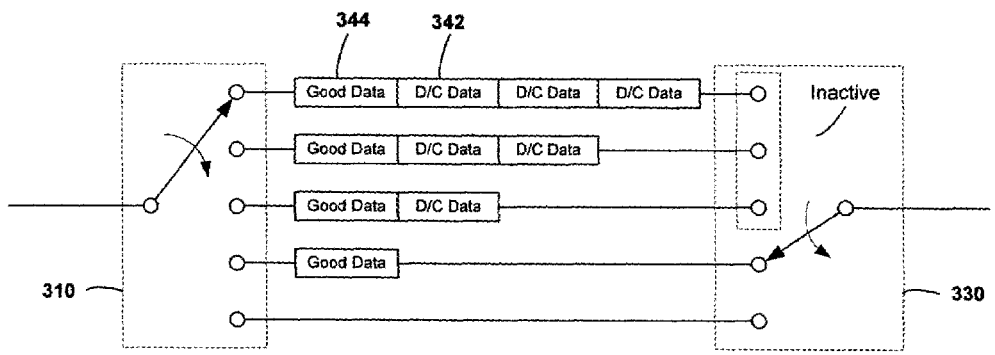
Figure 14:
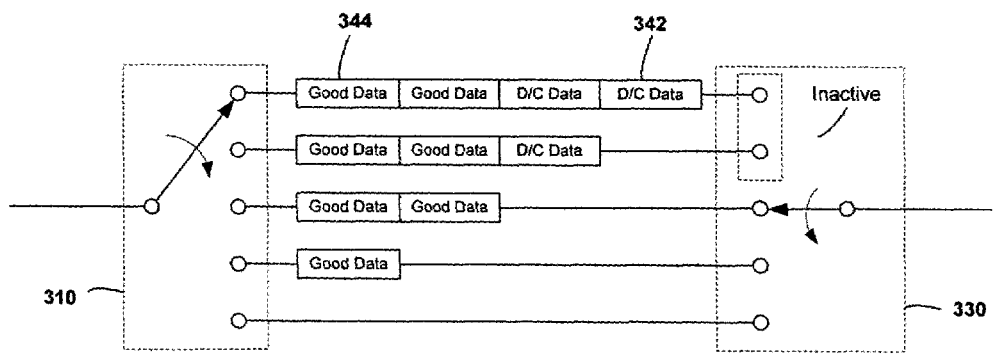
Figure 15:
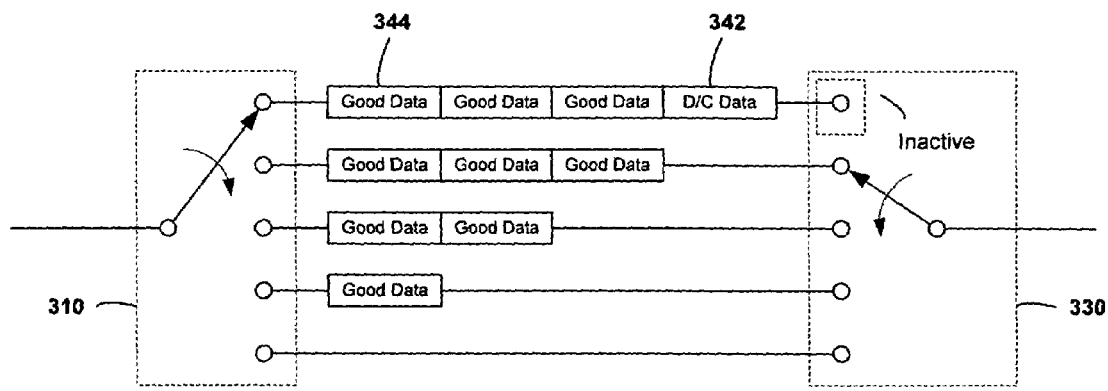

FIGS. 13 through 15 show points in this fill stage 1105 at which additional lines are set to be active. As shown in FIG. 13, the interleaver input switch 310 continues to connect the input line consecutively to each of the rows to supply valid data bits to all of the rows. The fourth row is now has its bit register filled with good data 344, and so is set to be active along with the fifth row. At this point, the first through third rows each have at least one bit register filled with don't-care data 342.

In FIG. 14, the third row becomes filled with good data 344 and so becomes active, while in FIG. 15, the second row becomes filled with good data 344 and so becomes active.

Figure 16:
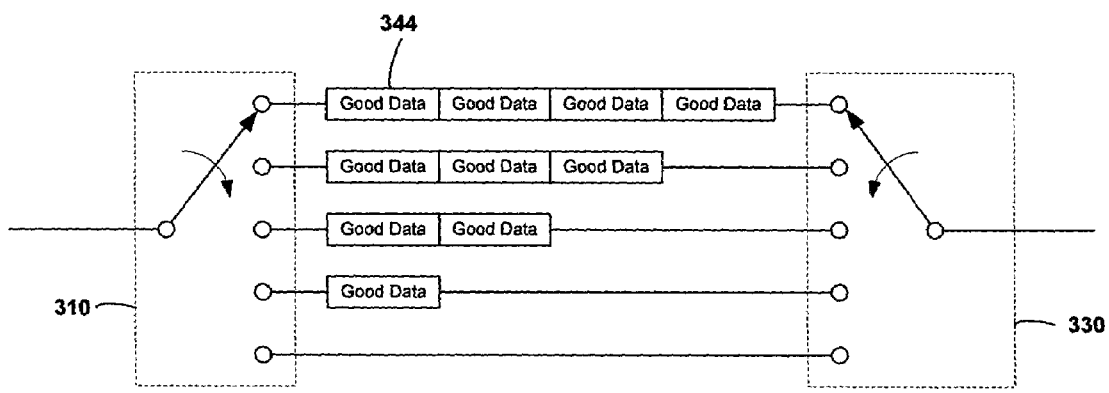

If the receiver controller 155 determines during the fill stage 1105 that the interleaver 150 is full of valid data (1130), then processing continues in the run stage 1145. At this point all of the rows should be set as active. This is shown by way of example in FIG. 16. As shown in FIG. 16, all of the rows are now either full of good data 344 (i.e., valid data bits), or have length of zero. Thus all of them are active, and the de-interleaver output switch 330 is set to connect to all of the rows in tandem with the de-interleaver input switch 310.

De-interleaver Run Stage

In the run stage 1110, the run process begins once the de-interleaver 150 is filled and the de-interleaver 150 starts receiving valid data at an input line during a payload period of a data frame. The receiver controller 155 operates the de-interleaver input switch 310 such that it sequentially provides one valid data bit to each active row. (1145) In this way, operation of the de-interleaver input switch 310 is the same as in the fill mode 1105

The receiver controller 155 also operates the de-interleaver output switch 330 in tandem with the de-interleaver input switch 310 such that it sequentially outputs one valid data bit from each active row. (1150) In any row with a length zero (i.e., no bit register 340), the valid input data bit is simply passed as the valid output data bit. In any row with a length greater than zero (i.e., having at least one bit register 340), the valid input data bit is entered into the first bit register in the row, all of the values in bit registers in the row are shifted one bit closer to the output, and the last bit in the row is provided as a valid output data bit.

Although shown in two separate blocks (1145 and 1150), the providing of a valid data bit to each active row and the outputting of a valid data bit from each active row may be performed in tandem. In the disclosed embodiment the de-interleaver input switch 310 and the de-interleaver output switch 330 are sequentially connected to each of the active rows at the same time at which point one valid data bit is input to the row and one valid data bit is output from the row. In embodiments that use other memory structures, however, the providing of data and the outputting of data may be performed separately.

In the disclosed embodiment if the transmitter 105 runs out of valid data bits it will fill up the remainder of the rows in its interleaver 120 with don't-care bits so that the interleaver 120 can be operated evenly. In this case the receiver 110 will receive an extra few don't care bits (less than N). In practical terms, however, the receiver 110 knows the length of the data transmission from the transmitter 105, so it should be able to count the incoming bits and know exactly where the data stream ends and compensate accordingly.

After a new data bit is provided to each row, and a corresponding data bit is output from each row, the receiver controller 155 determines whether any more input data is to be provided. (1155) If there is more input data, the receiver controller 155 controls the de-interleaver input switch 310 and the de-interleaver output switch 330 to again provide a valid data bit to each active row (1145), to again output a valid data bit from each active row (1150), and to again determine whether there is more input data. (1155)

If there is no more input data (1155), then the run stage 1110 ends and the empty stage 1115 begins.

Interleaver Empty Stage

In the empty stage 1115, the empty process begins once the de-interleaver 150 is no longer receiving new valid data at an input line, but instead has only the data remaining stored in the de-interleaver 150 to process. The process in the empty stage 1115 is essentially the reverse of the process in the fills stage 1105, so no specific illustrations are provided. However, FIGS. 12 through 16 examined in reverse essentially show this process, except that the identification of active and inactive lines is reversed.

In the empty stage 1115, the receiver controller 155 starts by determining whether any active line no longer has any valid data stored. (1160) At the beginning of the empty stage 1115, this will include any lines of zero length (i.e., any lines with no bit registers). The receiver controller 155 can perform this determination since it knows how many bit values have been received, what the switch connections have been in the de-interleaver 150, and how long each row is.

If at this point there is a line with no more active data, the receiver controller 155 will set as inactive any row or rows that no longer has valid data stored on it. (1165)

Then, after either no row or rows are determined to be empty of valid data (1160), or after any active row with no valid data is set to be inactive (1165), the receiver controller 155 operates the de-interleaver input switch 310 such that it sequentially provides one don't-care bit to each active row. (1170) This don't-care bit can be provided by a local don't care bit generator, or the don't care bit could be set by allowing whatever bit value was present at the input of a row to be the don't care value. Regardless, if the don't care bit is generated locally, no valuable channel time need be wasted sending a don't care bit.

The receiver controller 155 also operates the de-interleaver output switch 330 in tandem with the de-interleaver input switch 310 such that it sequentially outputs one valid data bit from each active row. (1175) In each active row, the don't-care bit is entered into the first bit register in the row, all of the values in bit registers in the row are shifted one bit closer to the output, and the last bit in the row is provided as a valid output data bit. Since the receiver controller 155 has blocked out any row with no active data, all remaining rows have at least one valid bit of data.

Although shown in two separate blocks (1170 and 1175), the providing of a don't-care bit to each active row and the outputting of a valid data bit from each active row may be performed in tandem. In the disclosed embodiment the de-interleaver input switch 310 and the de-interleaver output switch 330 are sequentially connected to each of the active rows at the same time at which point one don't-care bit is input to the row and one valid data bit is output from the row. In embodiments that use other memory structures, however, the providing of data and the outputting of data may be performed separately.

After the current active rows have received a don't-care bit (1170) and output a valid data bit (1175), the receiver controller 155 determines whether the de-interleaver 150 is empty of valid data. If not, the receiver controller 155 again determines whether any active rows no longer have valid data (1160) and continues processing from there. If the receiver controller 155 determines that the interleaver 150 is empty of valid data, then the empty stage 1115 and the entire receiving process 1100 ends. (1180)

Although FIGS. 12 through 16 show an exemplary de-interleaver that uses five rows with lengths zero, one, two, three, and four, more of fewer rows can be used, and the lengths of the rows can be varied. In addition, more or fewer bit registers can be used in each line, so long as the same bit register length is not used for all of the lines. Also, although FIGS. 12 through 16 disclose the use of bit registers to store don't-care bits and valid data bits, alternate embodiments could use other memory storage devices for this function, as described above.

By arranging the connections of the de-interleaver 150 in this manner, the receiver 110 ensures that each bit of data sent by the transmitter 105 will be delayed by exactly the same number of bit lengths from when it was originally provided to the interleaver 120 in the transmitter 105. As a result, a permuted order can be achieved during a data transmission 170 over a wireless channel, but the original order can be recaptured at the receiver.

Interleaver/De-Interleaver Operation

In particular, a method is provided of operating an interleaver circuit having N shift lines, each of the N shift lines having a shift line input node, a shift line output node, and one or more bit storage elements operating to perform a bit shifting operation between a respective shift line input node and a respective shift line output node. This method comprises: storing don't-care bits in each of the bit storage elements; isolating the N shift line output nodes from an interleaver output node; receiving a stream of new data bits at an interleaver input node; and sequentially connecting the interleaver input node to respective shift line input nodes to shift the stream of new data bits into the bit storage elements of corresponding shift lines in an interleaved fashion, wherein one of the don't-care bits is shifted out of each of the bit storage elements in corresponding shift lines as each of the new data bits are shifted in, wherein a last of the don't-care bits in each shift line is shifted out of respective bit storage elements during N consecutively-received data bits in the received stream of new data bits, and wherein at least two of the N shift lines have a different number of the bit storage elements.

The method may further comprise: sequentially connecting the interleaver input node to respective shift line input nodes to consecutively shift one bit from the stream of new data bits into the bit storage elements of corresponding shift lines in an interleaved fashion; sequentially connecting the respective shift line output nodes to the interleaver output node to shift out the stored data bits and provide the stored data bits as an interleaved data stream, wherein each time the interleaver input node is connected to the shift line input node of one of the N shift lines, the interleaver output node is connected to the shift line output node of the same one of the N shift lines.

The method may further comprise: sequentially connecting the interleaver input node to respective data line input nodes to consecutively provide one bit from the stream of new data bits to a corresponding data line in an interleaved fashion; and sequentially connecting respective data line output nodes to the interleaver output node to provide an interleaved data stream, wherein the interleaver circuit further comprises one or more direct lines directly connecting a direct line input node directly to a direct line output node, wherein the data line input nodes comprises the N shift line input nodes and the one or more direct line input nodes, the data line output nodes comprises the N shift line output nodes and the one or more direct line output nodes, and the data lines comprise the N shift lines and the one or more direct lines, and wherein each time the interleaver input node is connected to the data line input node of one of the data lines, the interleaver output node is connected to the data line output node of the same one of the data lines.

In this method, the interleaver circuit may be contained in a transmitter device, and the method may be performed while the transmitter device is transmitting at least one of a preamble and a header of a data packet.

In this method the don't-care bits may be stored in the bit storage elements by at least one of: powering up the bit storage elements and retaining transient data stored in the bit storage elements, or supplying don't-care bit values to the bit storage elements In this method the sequentially connecting of the interleaver input node to respective shift line input nodes may further comprise: selecting a group of shift lines from the N shift lines, each of which contains a largest number of remaining don't-care bits in corresponding bit storage elements; sequentially connecting the interleaver input node to shift line input nodes of the group of shift lines to shift sequential data bits selected from the new bit stream into the group of shift lines in an interleaved fashion; and repeating the selecting of the group of shift lines and the sequentially connecting of the interleaver input node to shift line input nodes until the last of the don't-care bits in each shift line is shifted out of respective bit storage elements.

In this method, the receiving device may be an ultra wideband device, and the method may be implemented in an integrated circuit.

A method is also provided of operating an interleaver circuit having N shift lines, each of the N shift lines having a shift line input node, a shift line output node, and one or more bit storage elements operating to perform a bit shifting operation between a respective shift line input node and a respective shift line output node, the method comprising: storing data bits in each of the bit storage elements in an interleaved pattern; sequentially connecting the interleaver output node to respective shift line output nodes to shift stored data bits from the bit storage elements of corresponding shift lines to form an output data stream, such that the interleaver output node is only ever connected to shift lines containing stored data; wherein a don't-care bit is shifted into a bit storage element in corresponding shift lines as each of the stored data bits are shifted out, wherein at least two of the N shift lines have a different number of the bit storage elements. If the interleaver operates on an already interleaved signal, it may also be referred to as a de-interleaver.

In the method, the interleaver circuit may be contained in a receiver device, and the method may be performed while the receiver device is not receiving a signal.

The method may further comprise isolating the N shift line input nodes from an interleaver input node prior to sequentially connecting the interleaver output node to the respective shift line output nodes.

In the method, the don't-care bits may be one of: locally-generated by the interleaver circuit, copies of existing data being shifted out of a bit storage element.

In the method, the sequentially connecting of the interleaver output node to respective shift line output nodes to shift stored data bits may further comprise: selecting a group of shift lines from the N shift lines, each of which contains stored data bits in corresponding bit storage elements; sequentially connecting the interleaver output node to shift line output nodes of the group of shift lines to shift sequential data bits stored in the bit storage elements to the interleaver output node to form the output bit stream; and repeating the selecting of the group of shift lines and the sequentially connecting of the interleaver input node to shift line input nodes until the last of the stored data bits in each shift line is shifted out of respective bit storage elements.

In the method, the receiving device may be an ultra wideband device, and the method may be implemented in an integrated circuit.

An interleaver circuit may be provided, the circuit comprising: N shift lines, each of the N shift lines including zero or more bit-storage elements; a first switch having a first input node and N first output nodes connected to first ends of the N shift lines, respectively, operating to selectively connect the first input node to one of the N first output nodes; an second switch having N second input nodes connected to second ends of the N shift lines, respectively, and a second output node, operating to selectively connect one of the N second input nodes to the second output node; and a controller for providing first control signals to direct first connections in the first switch, and second control signals to direct second connections in the second switch, wherein the controller can control the first switch to cycle through connecting the first input node with fewer than all of the N first output nodes, before repeating a node connection, and wherein at least two of the N shift lines have a different number of the bit storage elements.

The interleaver circuit may further comprise a bit generator for providing a stream of don't-care bits to the first input node in the first switch in response to a generator control signal provided by the controller.

In the interleaver circuit, each of the N shift lines may comprise a different number of the bit storage elements.

The interleaver circuit may be is in one of: an ultra wideband receiver, an ultra wideband transmitter, and an ultra wideband transceiver, and it may be implemented in an integrated circuit.

CONCLUSION

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A method of operating an interleaver circuit having N shift lines, each of the N shift lines having a shift line input node, a shift line output node, and one or more bit storage elements operating to perform a bit shifting operation between a respective shift line input node and a respective shift line output node, the method comprising:
    storing don't-care bits in each of the bit storage elements;
    isolating the N shift line output nodes from an interleaver output node;
    receiving a stream of new data bits at an interleaver input node; and
    sequentially connecting the interleaver input node to respective shift line input nodes to shift the stream of new data bits into the bit storage elements of corresponding shift lines in an interleaved fashion,
    wherein one of the don't-care bits is shifted out of each of the bit storage elements in corresponding shift lines as each of the new data bits are shifted in,
    wherein a last of the don't-care bits in each shift line is shifted out of respective bit storage elements during N consecutively-received data bits in the received stream of new data bits, and
    wherein at least two of the N shift lines have a different number of the bit storage elements.

2. A method of operating an interleaver circuit, as recited in claim 1, further comprising:
    sequentially connecting the interleaver input node to respective shift line input nodes to consecutively shift one bit from the stream of new data bits into the bit storage elements of corresponding shift lines in an interleaved fashion;
    sequentially connecting the respective shift line output nodes to the interleaver output node to shift out the stored data bits and provide the stored data bits as an interleaved data stream,
    wherein each time the interleaver input node is connected to the shift line input node of one of the N shift lines, the interleaver output node is connected to the shift line output node of the same one of the N shift lines.

3. A method of operating an interleaver circuit, as recited in claim 1, the method further comprising:
    sequentially connecting the interleaver input node to respective data line input nodes to consecutively provide one bit from the stream of new data bits to a corresponding data line in an interleaved fashion; and
    sequentially connecting respective data line output nodes to the interleaver output node to provide an interleaved data stream,
    wherein the interleaver circuit further comprises one or more direct lines directly connecting a direct line input node directly to a direct line output node,
    wherein the data line input nodes comprises the N shift line input nodes and the one or more direct line input nodes, the data line output nodes comprises the N shift line output nodes and the one or more direct line output nodes, and the data lines comprise the N shift lines and the one or more direct lines, and
    wherein each time the interleaver input node is connected to the data line input node of one of the data lines, the interleaver output node is connected to the data line output node of the same one of the data lines.

4. A method of operating an interleaver circuit, as recited in claim 1,
    wherein the interleaver circuit is contained in a transmitter device, and
    wherein the method is performed while the transmitter device is transmitting at least one of a preamble and a header of a data packet.

5. A method of operating an interleaver circuit, as recited in claim 1, wherein the don't-care bits are stored in the bit storage elements by at least one of: powering up the bit storage elements and retaining transient data stored in the bit storage elements, or supplying don't-care bit values to the bit storage elements 6. A method of operating an interleaver circuit, as recited in claim 1, wherein the sequentially connecting of the interleaver input node to respective shift line input nodes further comprises:
    selecting a group of shift lines from the N shift lines, each of which contains a largest number of remaining don't-care bits in corresponding bit storage elements;

sequentially connecting the interleaver input node to shift line input nodes of the group of shift lines to shift sequential data bits selected from the new bit stream into the group of shift lines in an interleaved fashion; and repeating the selecting of the group of shift lines and the sequentially connecting of the interleaver input node to shift line input nodes until the last of the don't-care bits in each shift line is shifted out of respective bit storage elements.

7. A method of operating an interleaver circuit, as recited in claim 1, wherein the receiving step is performed by an ultra wideband device.

8. A method of operating an interleaver circuit, as recited in claim 1, wherein the method is implemented in an integrated circuit.

9. A method of operating an interleaver circuit having N shift lines, each of the N shift lines having a shift line input node, a shift line output node, and one or more bit storage elements operating to perform a bit shifting operation between a respective shift line input node and a respective shift line output node, the method comprising:

storing data bits in each of the bit storage elements in an interleaved pattern;

sequentially connecting the interleaver output node to respective shift line output nodes to shift stored data bits from the bit storage elements of corresponding shift lines to form an output data stream, such that the interleaver output node is only ever connected to shift lines containing stored data;

wherein a don't-care bit is shifted into a bit storage element in corresponding shift lines as each of the stored data bits are shifted out, wherein at least two of the N shift lines have a different number of the bit storage elements.

10. A method of operating an interleaver circuit, as recited in claim 9, wherein the interleaver circuit is contained in a receiver device, and wherein the method is performed while the receiver device is not receiving a signal.

11. A method of operating an interleaver circuit, as recited in claim 10, wherein the receiving device is an ultra wideband device.

12. A method of operating an interleaver circuit, as recited in claim 10, further comprising isolating the N shift line input nodes from an interleaver input node prior to sequentially connecting the interleaver output node to the respective shift line output nodes.

13. A method of operating an interleaver circuit, as recited in claim 9, wherein the don't-care bits are one of: locally-generated by the interleaver circuit, copies of existing data being shifted out of a bit storage element.

14. A method of operating an interleaver circuit, as recited in claim 9, wherein the sequentially connecting of the interleaver output node to respective shift line output nodes to shift stored data bits further comprises:

selecting a group of shift lines from the N shift lines, each of which contains stored data bits in corresponding bit storage elements;

sequentially connecting the interleaver output node to shift line output nodes of the group of shift lines to shift sequential data bits stored in the bit storage elements to the interleaver output node to form the output bit stream; and repeating the selecting of the group of shift lines and the sequentially connecting of the interleaver input node to shift line input nodes until the last of the stored data bits in each shift line is shifted out of respective bit storage elements.

15. A method of operating an interleaver circuit, as recited in claim 9, wherein the method is implemented in an integrated circuit.

16. An interleaver circuit, comprising:

N shift lines, each of the N shift lines including zero or more bit-storage elements;

a first switch having a first input node and N first output nodes connected to first ends of the N shift lines, respectively, operating to selectively connect the first input node to one of the N first output nodes;

an second switch having N second input nodes connected to second ends of the N shift lines, respectively, and a second output node, operating to selectively connect one of the N second input nodes to the second output node; and a controller for providing first control signals to direct first connections in the first switch, and second control signals to direct second connections in the second switch, wherein the controller can control the second switch to cycle through connecting the second output node with fewer than all of the N second input nodes, before repeating a node connection, and wherein at least two of the N shift lines have a different number of the bit storage elements.

17. An interleaver circuit, as recited in claim 16, further comprising a bit generator for providing a stream of don't-care bits to the first input node in the first switch in response to a generator control signal provided by the controller.

18. An interleaver circuit, as recited in claim 16, wherein each of the N shift lines comprises a different number of the bit storage elements.

19. An interleaver circuit, as recited in claim 16, wherein the interleaver circuit is in one of: an ultra wideband receiver, an ultra wideband transmitter, and an ultra wideband transceiver.

20. An interleaver circuit, as recited in claim 16, wherein the interleaver circuit is implemented in an integrated circuit.

* * * * *